(12) United States Patent
Yuan et al.

(10) Patent No.: US 9,059,745 B2
(45) Date of Patent: Jun. 16, 2015

(54) ERROR CHECKING AND CORRECTION METHOD APPLIED IN A MULTI-CHANNEL SYSTEM AND RELATED CIRCUIT

(71) Applicant: JMicron Technology Corp., Hsin-Chu (TW)

(72) Inventors: Kuo-Hua Yuan, Hsinchu (TW); Chao-Nan Chen, Hsinchu (TW)

(73) Assignee: JMicron Technology Corp., Science-Based Industrial Park, Hsin-Chu (TW)

( * ) Notice: Subject to any disclaimer, the term of this patent is extended or adjusted under 35 U.S.C. 154(b) by 181 days.

(21) Appl. No.: 13/792,185

(22) Filed: Mar. 10, 2013

(65) Prior Publication Data

US 2014/0129897 A1 May 8, 2014

(30) Foreign Application Priority Data

Nov. 8, 2012 (TW) ............................. 101141606 A

(51) Int. Cl.
*H03M 13/00* (2006.01)
*H03M 13/29* (2006.01)
*H03M 13/27* (2006.01)

(52) U.S. Cl.
CPC .......... *H03M 13/2906* (2013.01); *H03M 13/27* (2013.01); *H03M 13/2909* (2013.01)

(58) Field of Classification Search
CPC ............ H03M 13/2906; H03M 13/27; H03M 13/2909
USPC ......................................... 714/752, 755, 758
See application file for complete search history.

(56) References Cited

U.S. PATENT DOCUMENTS

| 2005/0149819 | A1  | 7/2005  | Hwang |
| 2006/0256615 | A1  | 11/2006 | Larson |
| 2009/0024902 | A1  | 1/2009  | Jo |
| 2009/0063934 | A1  | 3/2009  | Jo |
| 2013/0282953 | A1* | 10/2013 | Orme et al. ................... 711/102 |

FOREIGN PATENT DOCUMENTS

| CN | 102541678 A | 7/2012 |
| CN | 102543209 A | 7/2012 |

* cited by examiner

*Primary Examiner* — Sam Rizk
(74) *Attorney, Agent, or Firm* — Winston Hsu; Scott Margo

(57) ABSTRACT

An exemplary method of error checking and correction applied in a multi-channel system, includes: performing error checking and correction encoding upon a first data packet of a first channel and a second data packet of a second channel, and generating a first horizontal error correction code and a second horizontal error correction code; performing error checking and correction encoding upon a first mixed data packet and a second mixed data packet, and generating a first vertical error correction code and a second vertical error correction code; and combining the first data packet, the first horizontal error correction code and the first vertical error correction code into the first encoded data packet of the first channel, and combining the second data packet, the second horizontal error correction code and the second vertical error correction code into the second encoded data packet of the second channel.

18 Claims, 11 Drawing Sheets

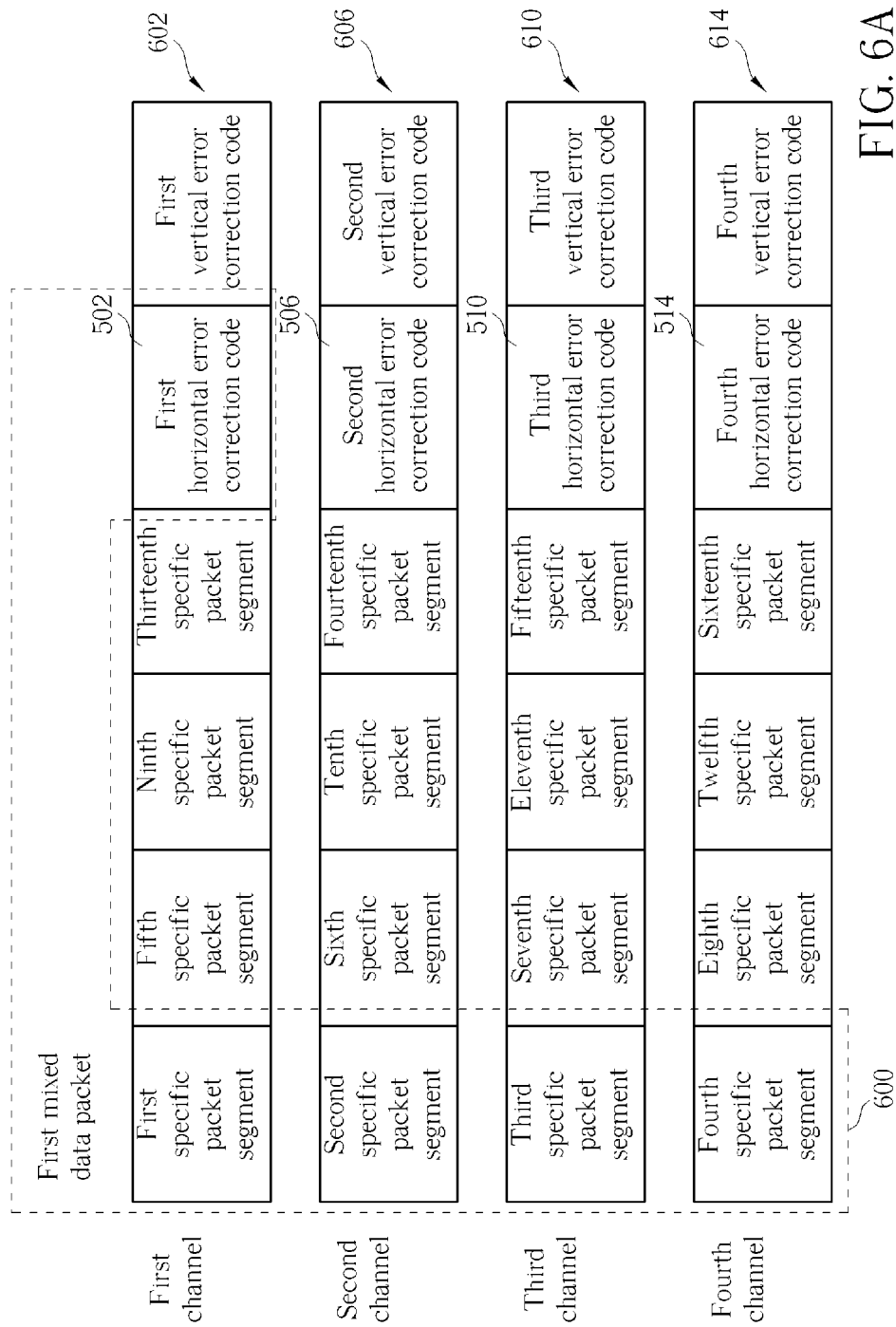

ERROR CHECKING AND CORRECTION METHOD APPLIED IN A MULTI-CHANNEL SYSTEM AND RELATED CIRCUIT

BACKGROUND OF THE INVENTION

1. Field of the Invention

The disclosed embodiments of the present invention relate to error checking and correction, and more particularly, to a method of error checking and correction applied in a multi-channel system, and a related circuit.

2. Description of the Prior Art

An error correction code (ECC) is a conventional error correction technique which can be applied in memory systems such as a NAND flash. The error correction technique is used to check the correctness of data sent to the memory. While the system is transferring data, for example, an extra 1-bit parity code is added to an 8-bit data as a correction code. When an error occurs, the error checking and correcting code will be able to self-correct the error, or request the system to resend data. This ensures normal system operation by preventing crashing due to data errors. Since using ECC involves this extra debugging step, the operating speed of an ECC memory is slightly slower than a non-ECC memory. In addition, since the error correcting code (e.g., the parity code) is added to the ECC memory, operating bit length becomes longer: e.g. 72-bits instead of the conventional 64-bits. This type of memory is usually used in high-end computers such as servers.

Conventionally, while writing data into multi-channel memories, each channel respectively generates an error correction code; while reading out data from the multi-channel memories, the error checking and correction procedure is processed for each channel according to the corresponding error correction code of each channel. In actual operations, however, there may be a large number of error bits which appear in a specific channel, but no error bits or only a small amount of error bits in the other channels. The imbalance is representative of space for completely exploiting the error checking and correction code in the memory, and therefore, there is a need for an innovative error checking and correction design which can fully utilize the error checking and correction code in the memory for enhancing performance.

SUMMARY OF THE INVENTION

One of the objectives of the disclosed present invention is to provide a method of error checking and correction applied for a multi-channel system, and a related circuit, to solve the above mentioned issues.

According to a first aspect of the present invention, a method of error checking and correction applied in a multi-channel system is disclosed. The method of error checking and correction applied in a multi-channel system comprises: performing error checking and correction encoding upon a first data packet of a first channel and a second data packet of a second channel respectively, and generating a first horizontal error correction code and a second horizontal error correction code; performing error checking and correction encoding upon a first mixed data packet and a second mixed data packet, and generating a first vertical error correction code and a second vertical error correction code; and combining the first data packet, the first horizontal error correction code and the first vertical error correction code into the first encoded data packet of the first channel, and combining the second data packet, the second horizontal error correction code and the second vertical error correction code into the second encoded data packet of the second channel.

According to a second aspect of the present invention, a method of error checking and correction applied in a multi-channel system is disclosed. The method of error checking and correction applied in a multi-channel system comprises: reading a first encoded data packet from a first channel, wherein the first encoded data packet comprises a first data packet, a first horizontal error correction code, and a first vertical error correction code; reading a second encoded data packet from a second channel, wherein the second encoded data packet comprises a second data packet, a second horizontal error correction code, and a second vertical error correction code; performing error checking and correction decoding upon the first data packet and the second data packet respectively according to the first horizontal error correction code and the second horizontal error correction code, and generating a first horizontal decoding data packet and a second horizontal decoding data packet; and performing error checking and correction decoding upon a first mixed data packet and a second mixed data packet according to the first vertical error correction code and the second vertical error correction code, wherein the first mixed data packet comprises at least a part of the packet data of the first horizontal decoded data packet and a part of the packet data of the second horizontal decoded data packet, and the second mixed data packet comprises at least a part of the packet data of the first horizontal decoded data packet and a part of the packet data of the second horizontal decoded data packet.

According to a third aspect of the present invention, a circuit for error checking and correction applied in a multi-channel system is disclosed. The circuit for error checking and correction applied in a multi-channel system comprises a first error correction code encoder, a second error correction code encoder, and a packet generator. The first error correction code encoder is arranged for performing error checking and correction encoding upon a first data packet of a first channel and a second data packet of a second channel respectively, and generating a first horizontal error correction code and a second horizontal error correction code respectively. The second error correction code encoder is arranged for performing error checking and correction encoding upon a first mixed data packet and a second mixed data packet, and generating a first vertical error correction code and a second vertical error correction code, wherein the first mixed data packet comprises at least a part of the packet data of the first data packet and a part of the packet data of the second data packet, and the second mixed data packet comprises at least a part of the packet data of the first data packet and a part of the packet data of the second data packet. The packet generator is arranged for combining the first data packet, the first horizontal error correction code, and the first vertical error correction code into the first encoded data packet of the first channel, and combining the second data packet, the second horizontal error correction code and the second vertical error correction code into the second encoded data packet of the second channel.

According to a fourth aspect of the present invention, a circuit for error checking and correction applied in a multi-channel system is disclosed. The circuit for error checking and correction applied in a multi-channel system comprises a first packet parser, a second packet parser, a first error correction code decoder, and a second error correction code decoder. The first packet parser is arranged for reading a first encoded data packet from a first channel, wherein the first encoded data packet comprises a first data packet, a first horizontal error correction code, and a first vertical error correction code. The second packet parser is arranged for reading a second encoded data packet from a second channel, wherein the second encoded data packet comprises a second data packet, a second horizontal error correction code, and a second vertical error correction code. The first error correction code decoder is arranged for performing error checking and correction decoding upon the first data packet and the second data packet respectively according to the first horizontal error correction code and the second horizontal error correction code, and generating a first horizontal decoding data packet and a second horizontal decoding data packet. The second error correction code decoder is arranged for performing error checking and correction decoding upon a first mixed data packet and a second mixed data packet according to the first vertical error correction code and the second vertical error correction code, wherein the first mixed data packet comprises at least a part of the packet data of the first horizontal decoded data packet and a part of the packet data of the second horizontal decoded data packet, and the second mixed data packet comprises at least a part of the packet data of the first horizontal decoded data packet and a part of the packet data of the second horizontal decoded data packet.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6A is a diagram illustrating a first mixed data packet in a four-channel system according to an exemplary embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

In a conventional memory access system, in order to solve the problem of data error, an appropriate error correcting code (ECC) is applied to detect and correct errors while performing data transmission. In this way, the receiving end can detect and correct transmission errors via examining encoded data. The error correction code checks the information stored in the memory electronically. Memories with error checking and correction functions are mainly for high-end PCs, servers or workstations, in order to avoid an increasing risk of system crash induced by single-bit memory error. Due to interference encountered by respective channels not being the same, and ditto for a corresponding memory unit, error bit(s) tend not to occur in the data packets of all channels simultaneously. The disclosed embodiments of the present invention therefore enhance the performance of error checking and correction functions by adding a vertical error correction code as well as the horizontal error correction code (i.e., the conventional error checking and correction method). A detailed description is below.

Figure 1:
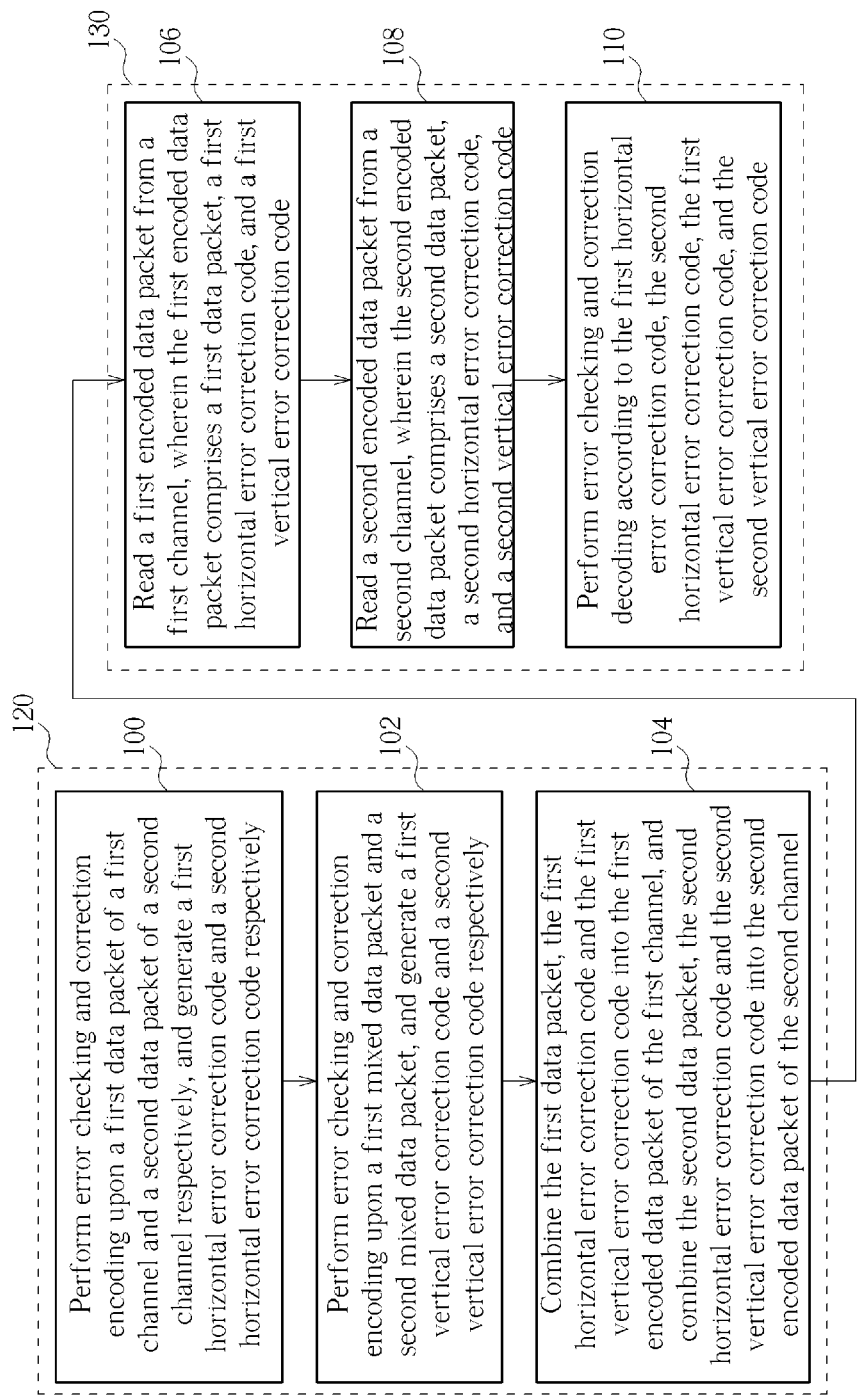
FIG. 1 is a flowchart illustrating a method of error checking and correction according to an exemplary embodiment of the present invention.

Please refer to FIG. 1, which is a flowchart illustrating a method of error checking and correction according to an exemplary embodiment of the present invention. Provided that substantially the same result is achieved, the steps of the flowchart shown in FIG. 1 need not be in the exact order shown and need not be contiguous; that is, other steps can be intermediate. Some steps in FIG. 1 may be omitted according to various types of embodiments or requirements. The method may be briefly summarized as follows:

Step 100: Perform error checking and correction encoding upon a first data packet of a first channel and a second data packet of a second channel respectively, and generate a first horizontal error correction code and a second horizontal error correction code respectively;

Step 102: Perform error checking and correction encoding upon a first mixed data packet and a second mixed data packet, and generate a first vertical error correction code and a second vertical error correction code respectively;

Step 104: Combine the first data packet, the first horizontal error correction code and the first vertical error correction code into the first encoded data packet of the first channel, and combine the second data packet, the second horizontal error correction code and the second vertical error correction code into the second encoded data packet of the second channel;

Step 106: Read a first encoded data packet from a first channel, wherein the first encoded data packet comprises a first data packet, a first horizontal error correction code, and a first vertical error correction code;

Step 108: Read a second encoded data packet from a second channel, wherein the second encoded data packet comprises a second data packet, a second horizontal error correction code, and a second vertical error correction code; and Step 110: Perform error checking and correction decoding according to the first horizontal error correction code, the second horizontal error correction code, the first vertical error correction code, and the second vertical error correction code.

Figure 2:
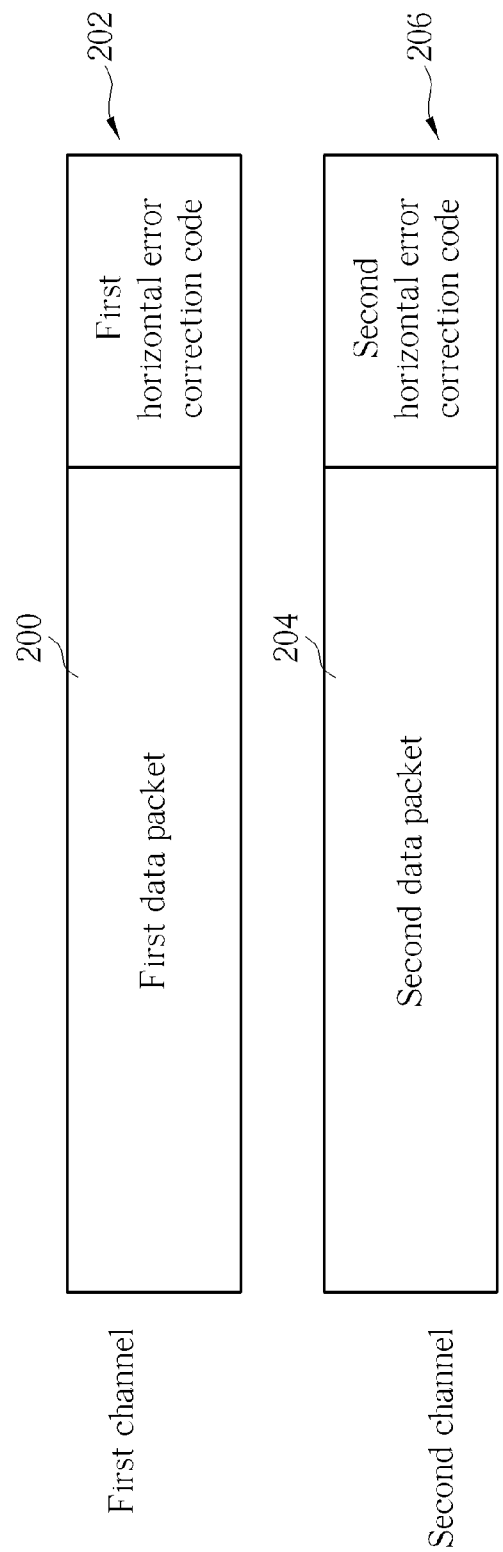
FIG. 2 is a diagram illustrating two horizontal error correction codes for respective two-channel data packets according to an exemplary embodiment of the present invention.

Please note that steps 100 to 104 of the embodiment shown in FIG. 1 of the present invention are for writing data into a multi-channel memory (e.g., a flash memory); i.e., a multi-channel data write-in process 120. Steps 106 to 110 are for reading data from a multi-channel memory; i.e., a multi-channel data read-out process 130. For an illustration of the multi-channel data write-in process 120, please also refer to FIG. 7, which is a diagram illustrating a multi-channel error checking and correcting circuit 700 according to an exemplary embodiment of the present invention. In this embodiment, the multi-channel error checking and correction circuit 700 is utilized to write data into a multi-channel memory having at least a first channel and a second channel. It should be noted that, under the premise of not affecting the disclosure of the present invention, a data write-in operation of a two-channel system is used to describe the disclosed multi-channel error checking and correction mechanism of the present invention. In practice, the disclosed multi-channel error checking and correction mechanism of the present invention can be applied to a data write-in operation of an N-channel system, wherein N≥2. The multi-channel error checking and correction circuit 700 includes a first packet dividing circuit 702, a second packet dividing circuit 704, a first mixed packet generating circuit 706, a second mixed packet generating circuit 708, a first error correction code encoder 710, a second error correction code encoder 712, and a packet generator 714. First, as shown in step 100, the first error correction code encoder 710 performs error checking and correction encoding (e.g., parity code encoding) upon a first data packet $D_{ch0}$ of the first channel and a second data packet $D_{ch1}$ of the second channel, and generates a first horizontal error correction code PARITY_$H_{ch0}$ and a second horizontal error correction code PARITY_$H_{ch1}$. Please refer to FIG. 2, which is a diagram illustrating two horizontal error correction codes for respective two-channel data packets according to an exemplary embodiment of the present invention, wherein the first data packet 200 is the above first data packet $D_{ch0}$, the second data packet 204 is the above second data packet $D_{ch1}$, the first horizontal error correction code 202 is the above first horizontal error correction code PARITY_$H_{ch0}$, and the second horizontal error correction code 206 is the above second horizontal error correction code PARITY_$H_{ch1}$.

Figure 3:
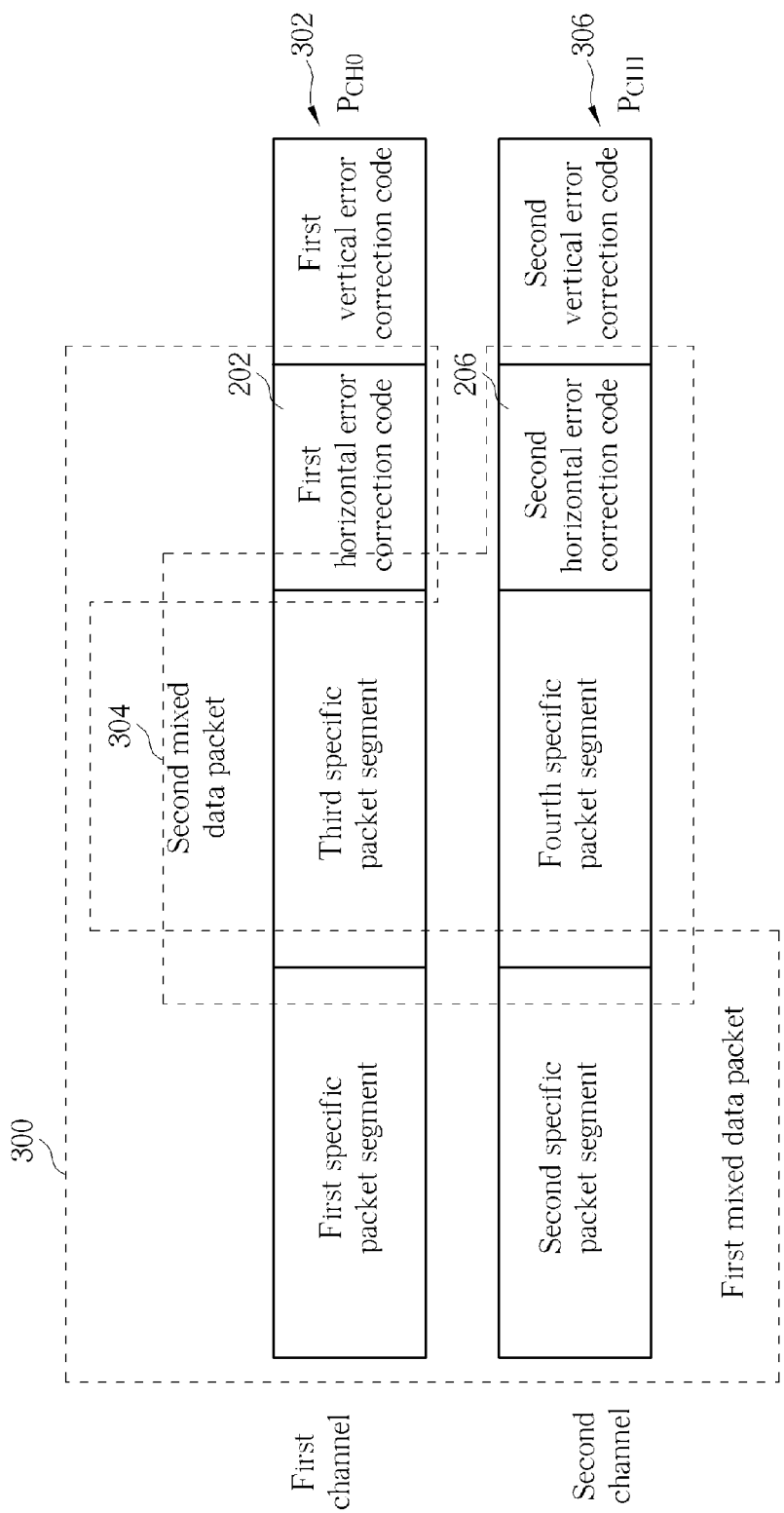
FIG. 3 is a diagram illustrating two vertical error correction codes for respective two-channel data packets according to an exemplary embodiment of the present invention.

Please refer to FIG. 3, which is a diagram illustrating two vertical error correction codes for respective two-channel data packets according to an exemplary embodiment of the present invention. In this exemplary embodiment, the first packet dividing circuit 702 and the second packet dividing circuit 704 perform equal dividing procedures upon the first data packet $D_{ch0}$ of the first channel and the second data packet $D_{ch1}$ of the second channel respectively. In other words, the first packet dividing circuit 702 may divide the first data packet $D_{ch0}$ of the first channel equally into a plurality of specific packet segments (e.g. a first specific packet segment and a third specific packet segment) according to the design considerations/requests. The first specific packet segment and the third specific packet segment may constitute the first data packet $D_{ch0}$ of the first channel. Likewise, the second packet dividing circuit 704 may divide the second data packet $D_{ch1}$ of the second channel equally into a plurality of specific packet segments (e.g. a second specific packet segment and a fourth specific packet segment) according to the design considerations/requests. The second specific packet segment and the fourth specific packet segment may constitute the second data packet $D_{ch1}$ of the second channel. It should be noted that, in the first data packet $D_{ch0}$, the first specific packet segment is different from the third specific packet segment: the contents of the first specific packet segment and the contents of the third specific packet segment are not repeated (overlapped). Similarly, the second specific packet segment is different from the fourth specific packet segment: the bits of the second specific packet segment and the bits of the fourth specific packet segment are not repeated (overlapped). The packet dividing and mixing method of the present invention is not limited to a two-channel or said method which divides original packet into two segments equally, however. In practice, any number of channels of a multi-channel memory system as well as any mechanism which can mix multi-channel data packets may also be applied.

Figure 7:
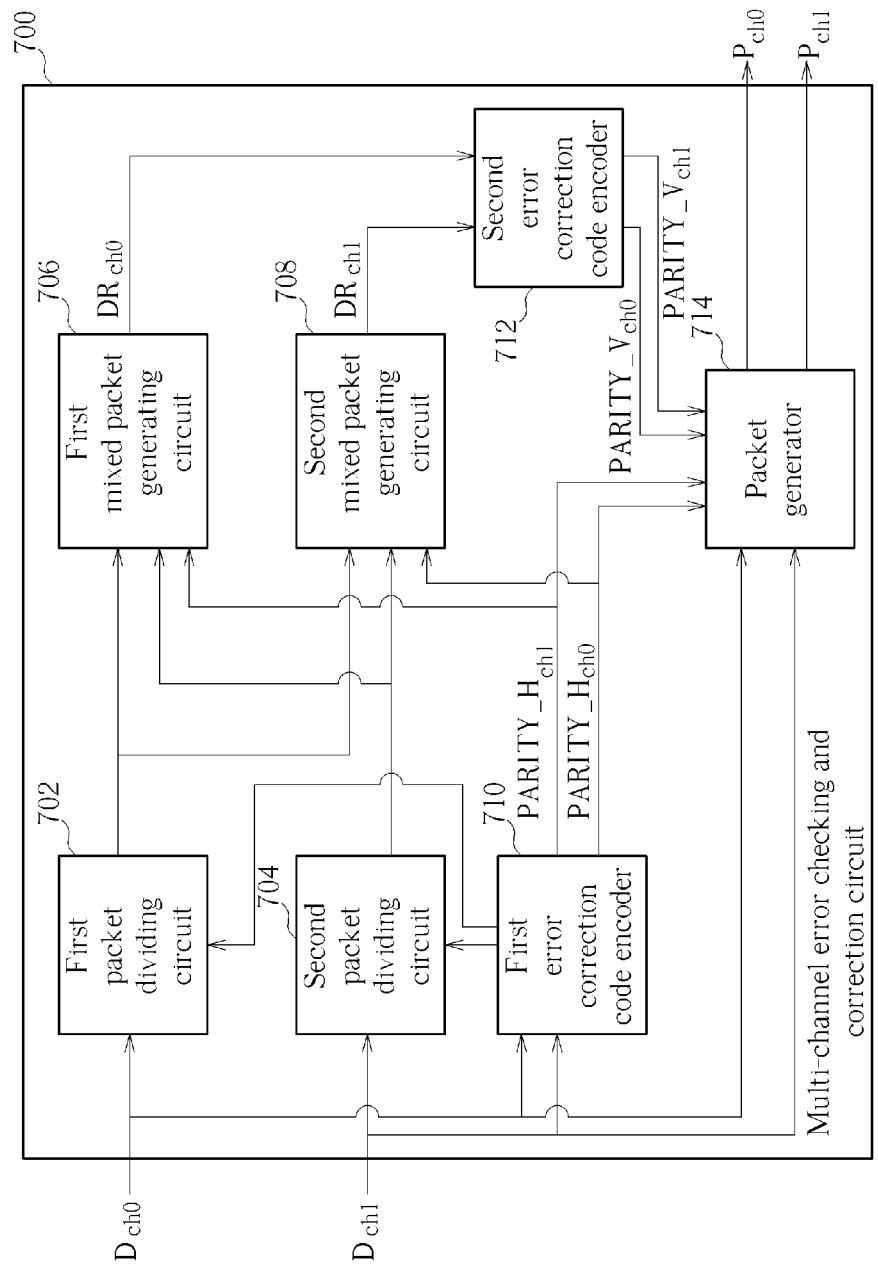
FIG. 7 is diagram illustrating a multi-channel error checking and correcting circuit according to an exemplary embodiment of the present invention.

The first mixed packet generating circuit 706 shown in FIG. 7 is utilized to select the first specific packet segment of the first data packet and the second specific packet segment of the second data packet for combining with the first horizontal error correction code PARITY_$H_{ch0}$ to be a first mixed data packet $DR_{ch0}$ (i.e. the first mixed data packet 300 shown in FIG. 3). In the same manner, the second mixed packet generating circuit 708 shown in FIG. 7 is utilized to select the third specific packet segment of the first data packet and the fourth specific packet segment of the second data packet for combining with the second horizontal error correction code PARITY_$H_{ch1}$ to be a second mixed data packet $DR_{ch1}$ (i.e. the second mixed data packet 304 shown in FIG. 3). Thus, the second error correction code encoder 712 can perform error checking and correction encoding (e.g. parity code encoding) upon the first mixed data packet $DR_{ch0}$ and the second mixed data packet $DR_{ch1}$ respectively, and generate a first vertical error correction code PARITY_$H_{ch0}$ and a second vertical error correction code PARITY_$H_{ch0}$ (i.e. step 102). These are the first vertical error correction code 302 and the second vertical error correction code 306 illustrated in FIG. 3. In step 104 (the last step of the multi-channel data write-in process 120), a packet generator 714 is used to combine the first data packet $D_{ch0}$, the first horizontal error correction code PARITY_$H_{ch0}$, and the first vertical error correction code PARITY_$V_{ch0}$ into a first encoded data packets $P_{ch0}$ of the channel 1, and combine the second data packet $D_{ch1}$, the second horizontal error correction code PARITY_$H_{ch1}$, and the second vertical error correction code PARITY_$V_{ch1}$ into a second encoded data packets $P_{ch1}$ of the channel 2, as shown in FIG. 3.

Figure 4:
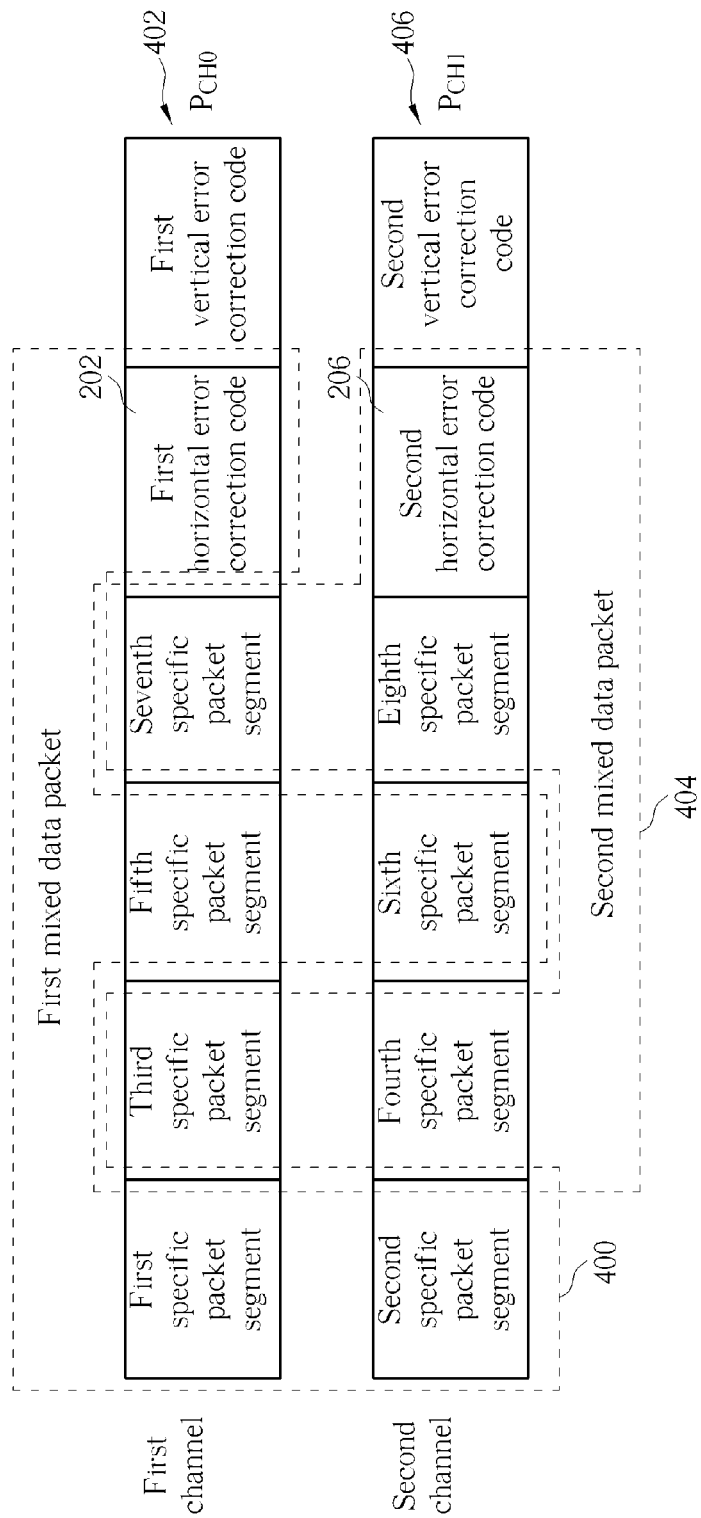
FIG. 4 is a diagram illustrating two vertical error correction codes for respective two-channel data packets according to another embodiment of the present invention.

Please note that the above method of dividing the original packet into two specific segments equally, and configuring the first horizontal error correction code PARITY_$H_{ch0}$ and the second horizontal error correction code PARITY_$H_{ch1}$ only into the first mixed data packet $DR_{ch0}$ and the second mixed data packet $DR_{ch1}$ respectively are for illustrative purposes only, rather than limiting the scope of the present invention. For example, the first horizontal error correction code PARITY_$H_{ch0}$ may be equally divided into segments and then configured in the first mixed data packet $DR_{ch0}$ and the second mixed data packet $DR_{ch1}$ respectively; in the same way, the second horizontal error correction code PARITY_$H_{ch1}$ may be equally divided into segments and then configured in the first mixed data packet $DR_{ch0}$ and the second mixed data packet $DR_{ch1}$ respectively. In another example, the first horizontal error correction code PARITY_$H_{ch0}$ and the second horizontal error correction code PARITY_$H_{ch1}$ are not added into the first mixed data packet $DR_{ch0}$ and the second mixed data packet $DR_{ch1}$. Any method of mixed data packet configuration and generation, which does not violate the spirit of the present invention, belongs to the scope of the present invention. Please refer to FIG. 4, which is a diagram illustrating two vertical error correction codes for respective two-channel data packets according to another embodiment of the present invention. In this embodiment, the method of generating a first horizontal error correction code 202 and a second horizontal error correction code 206 are the same as the conventional practice; therefore, a detailed description is omitted here for brevity. The present embodiment is characterized in that the first data packet $D_{ch0}$ of the first channel and the second data packet $D_{ch1}$ of the second channel are divided into 2*K segments (K≥2) equally. For example, K=2, therefore the first data packet $D_{ch0}$ of the first channel is divided into a first specific packet segment, a third specific packet segment, a fifth specific packet segment, as well as a seventh specific packet segment. To put it another way, the first specific packet segment, the third specific packet segment, the fifth specific packet segment, and the seventh specific packet segment constitute the first data packet $D_{ch0}$ of the first channel. Likewise, the second data packet $D_{ch1}$ of the second channel is divided into a second specific packet segment, a fourth specific packet segment, a sixth specific packet segment, as well as a eighth specific packet segment; the second specific packet segment, the fourth specific packet segment, the sixth specific packet segment, and the eighth specific packet segment constitute the second data packet $D_{ch1}$ of the second channel. It should be noted that, in the first data packet $D_{ch0}$, the contents of the first specific packet segment, the third specific packet segment, the fifth specific packet segment, and the seventh specific packet segment are not repeated (overlapped); similarly, the contents of the second specific packet segment, the fourth specific packet segment, the sixth specific packet segment, and the eighth specific packet segment are not repeated (overlapped).

The first mixed packet generating circuit 706 selects the first specific packet segment and the fifth specific packet segment of the first data packet, the second specific packet segment and the sixth specific packet segment of the second data packet, and the first horizontal error correction code 202 to be combined into a first mixed data packet 400. In the same manner, the second mixed packet generating circuit 708 selects the third specific packet segment and the seventh specific packet segment of the first data packet, the fourth specific packet segment and the eighth specific packet segment of the second data packet, and the second horizontal error correction code 206 to be combined into a second mixed data packet 404. Finally, the second error correction code encoder 712 performs error checking and correction encoding (e.g., parity code encoding) upon the first mixed data packet and the second mixed data packet respectively, and generates a first vertical error correction code 402 as well as a second vertical error correction code 406. This alternative design also belongs to the scope of the present invention.

Figure 5:
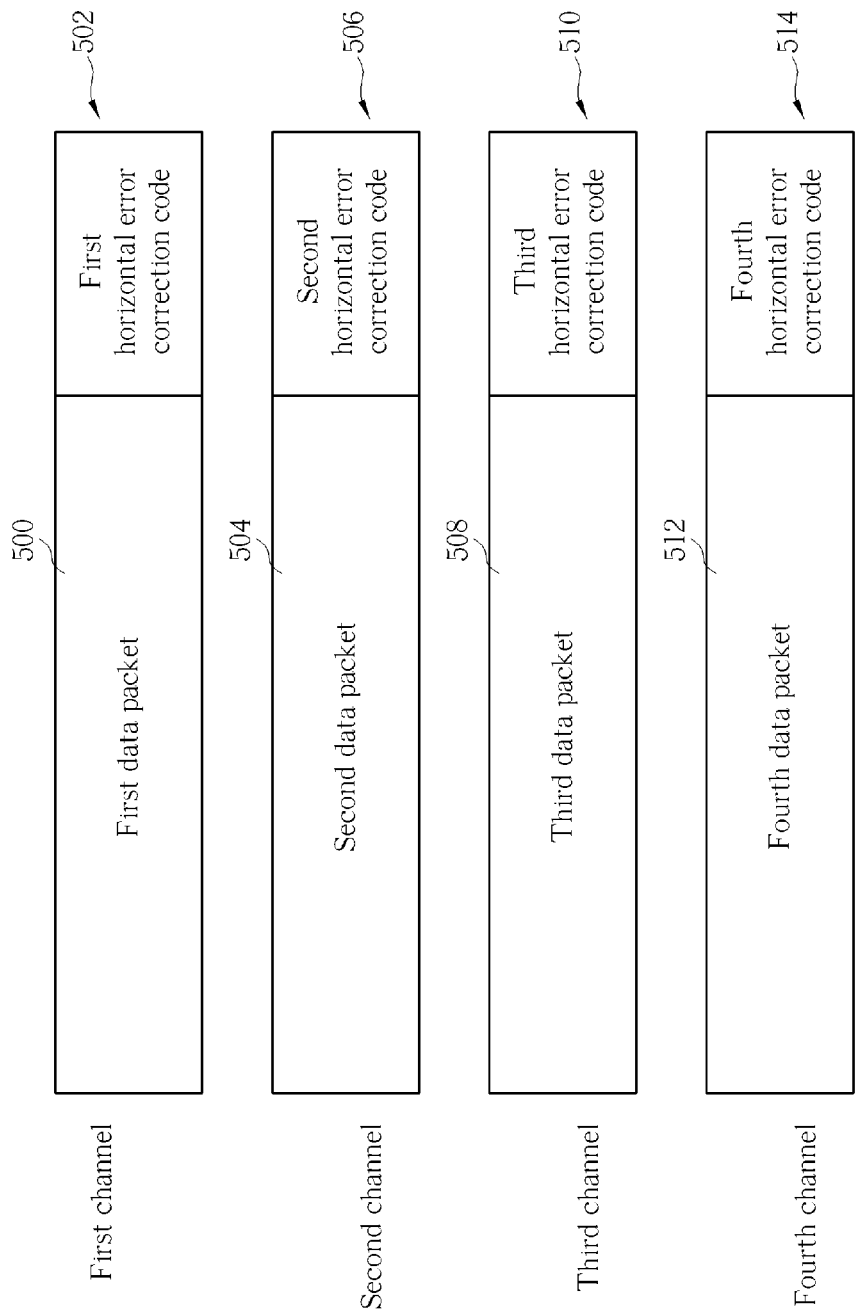
FIG. 5 is a diagram illustrating four horizontal error correction codes for respective four-channel data packets according to an exemplary embodiment of the present invention.
Figure 6B:
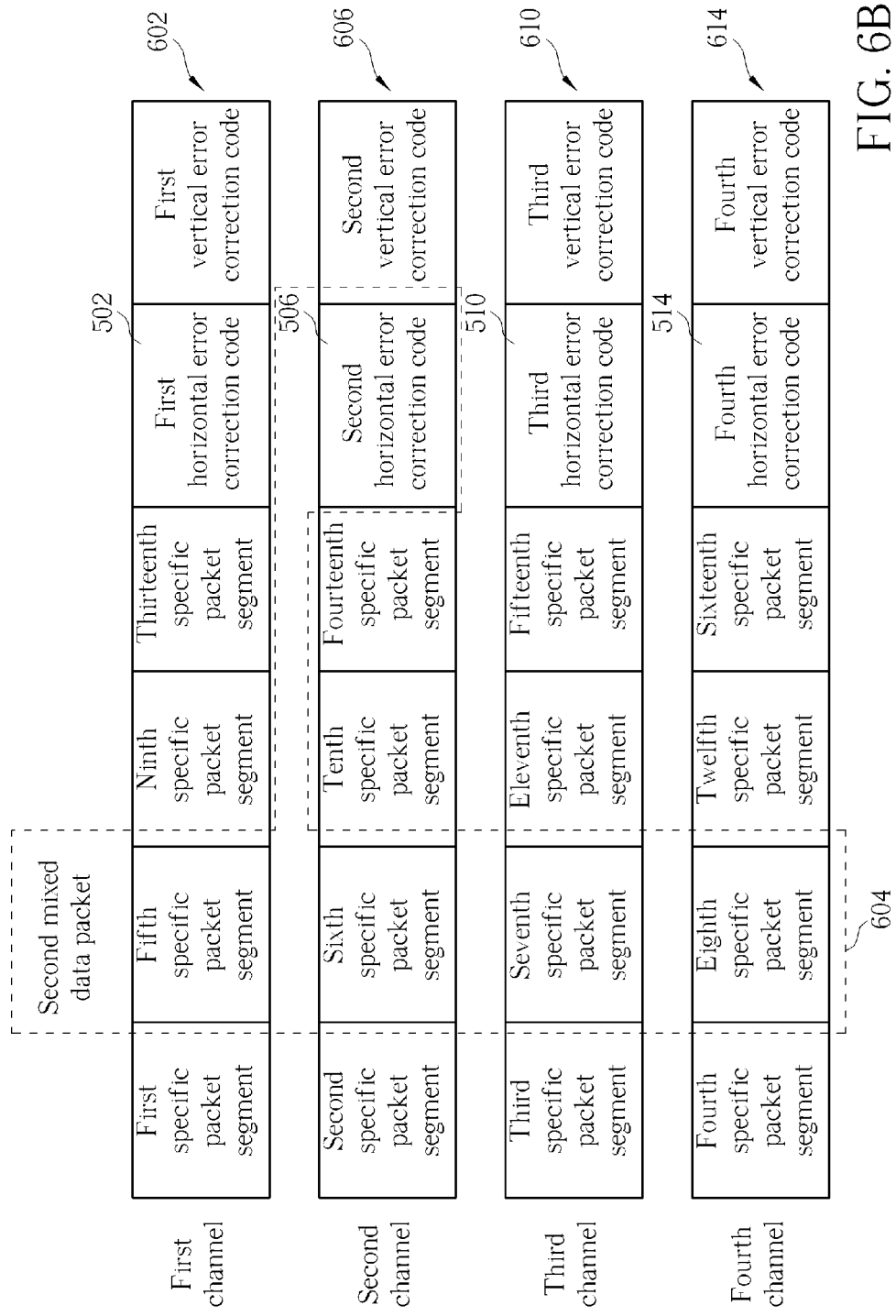
FIG. 6B is a diagram illustrating a second mixed data packet in a four-channel system according to an exemplary embodiment of the present invention.
Figure 6C:
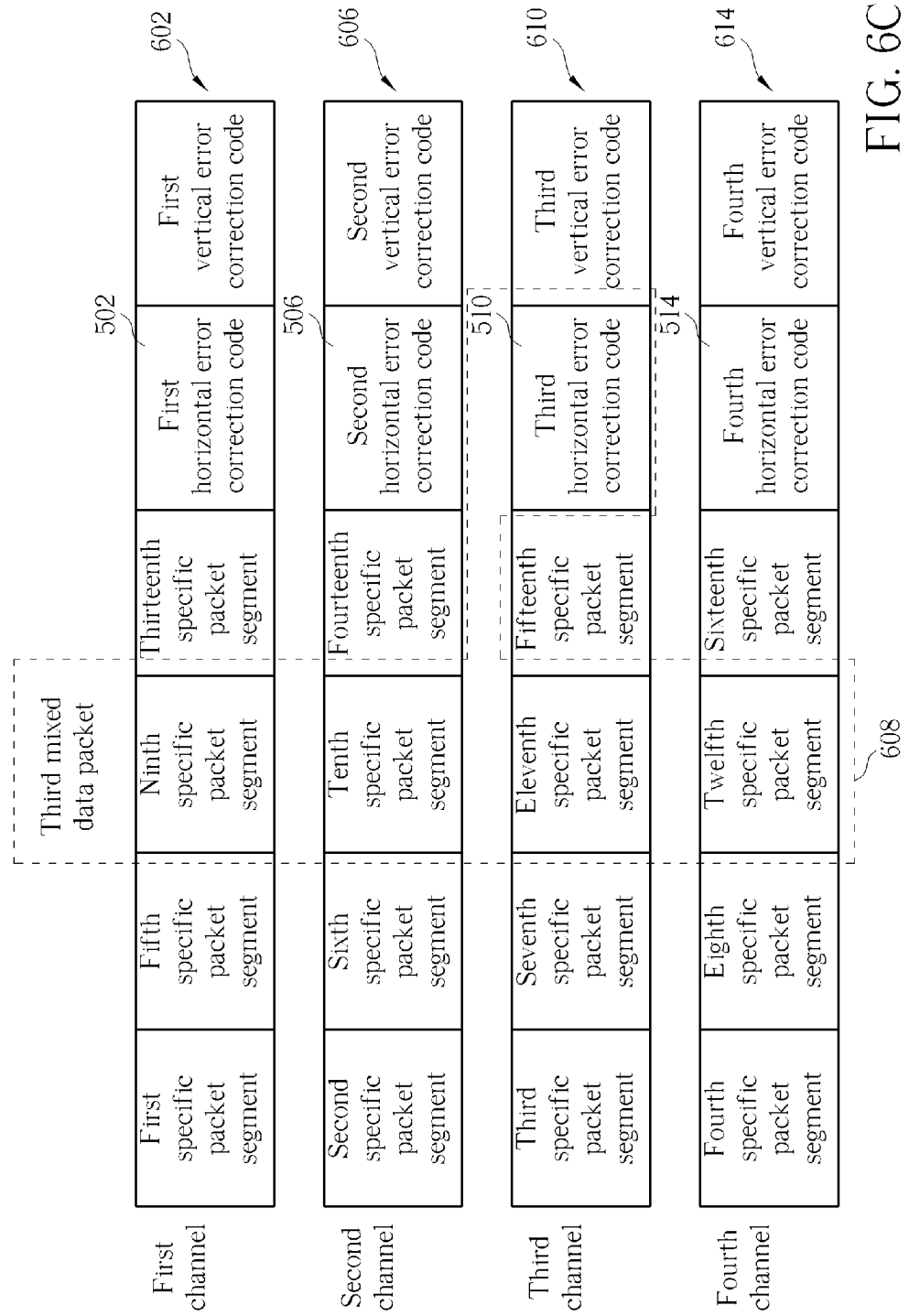
FIG. 6C is a diagram illustrating a third mixed data packet in a four-channel system according to an exemplary embodiment of the present invention.
Figure 6D:
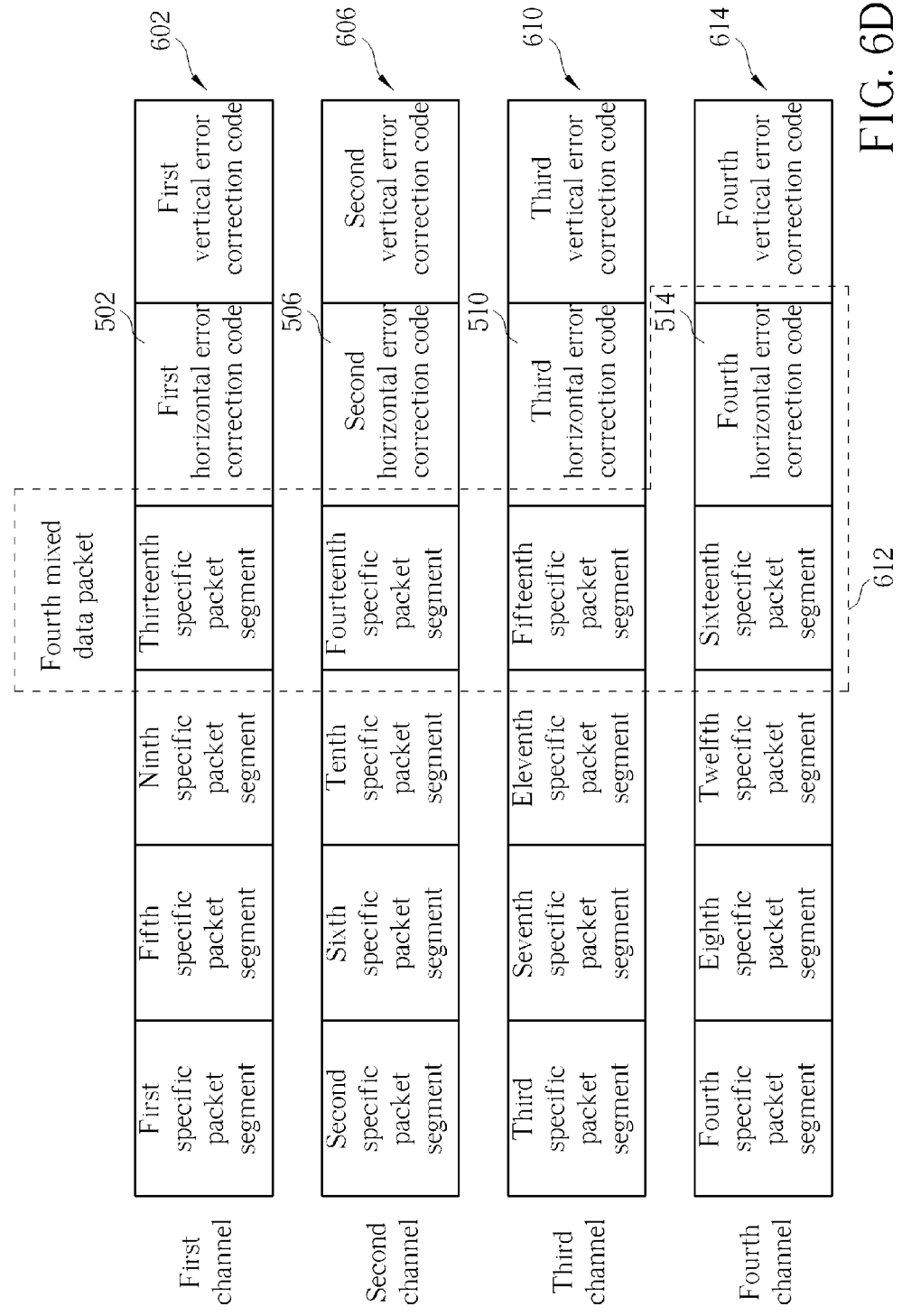
FIG. 6D is a diagram illustrating a fourth mixed data packet in a four-channel system according to an exemplary embodiment of the present invention.

Please refer to FIG. 5 in conjunction with FIG. 6A, FIG. 6B, FIG. 6C, and FIG. 6D. FIG. 5 is a diagram illustrating four horizontal error correction codes for respective four-channel data packets according to an exemplary embodiment of the present invention. In this embodiment, a first horizontal error correction code 502 of the first data packet 500 of the first channel, a second horizontal error correction code 506 of the second data packet 504 of the second channel, a third horizontal error correction code 510 of the third data packet 508 of the third channel, and a fourth horizontal error correction code 514 of the fourth data packet 512 of the fourth channel are generated in the same way as conventional practices; therefore, a detailed description is omitted here. FIG. 6A, FIG. 6B, FIG. 6C, and FIG. 6D are diagrams illustrating four vertical error correction codes for respective four-channel data packets according to an exemplary embodiment of the present invention. In this embodiment, the first data packet of the first channel, the second data packet of the second channel, the third data packet of the third channel, and the fourth data packet of the fourth channel are divided into four equal segments respectively. The multi-channel error checking and correction circuit 700 shown in FIG. 7 may be configured to have four packet dividing circuits, for performing the packet dividing process of the data packet of the first channel to the fourth channel respectively, via appropriate modifications, wherein the first data packet of the first channel will be equally divided into a first specific packet segment, a fifth specific packet segment, a ninth specific packet segment and a thirteenth specific packet segment. In other words, the first specific packet segment, the fifth specific packet segment, the ninth specific packet segment, and the thirteenth specific packet segment constitute the first data packet of the first channel. The second data packet of the second channel will be equally divided into a second specific packet segment, a sixth specific packet segment, a tenth specific packet segment, and a fourteenth specific packet segment; in other words, the second specific packet segment, the sixth specific packet segment, the tenth specific packet segment, and the fourteenth specific packet segment constitute the second data packet of the second channel. The third data packet of the third channel will be equally divided into a third specific packet segment, a seventh specific packet segment, an eleventh specific packet segment, and a fifteenth specific packet segment; in other words, the third specific packet segment, the seventh specific packet segment, the eleventh specific packet segment, as well as the fifteenth specific packet segment constitute the third data packet of the third channel. Similarly, the fourth data packet of the fourth channel will be equally divided into a fourth specific packet segment, an eighth specific packet segment, a twelfth specific packet segment, and a sixteenth specific packet segment; in other words, the fourth specific packet segment, the eighth specific packet segment, the twelfth specific packet segment, and the sixteenth specific packet segment constitute the fourth data packet of the fourth channel.

The channel error checking and correction circuit 700 shown in FIG. 7 may be modified via an appropriate four mixed packet generating circuit, respectively, for processing the first channel to the fourth channel of a particular packet segment and a horizontal error correction code packet of the first channel to the fourth channel by performing a mixing operation to produce the first mixed data packets 600, second mixed data packets 604, third mixed data packets 608 and fourth mixed data packets 612. Specifically, the circuit will select the first data packet of the first specific packet segment, the second data packet of the second specific packet segment, the third data packet of the third specific packet segment, and the first four data packets of the fourth specific packet segment as well as the first horizontal correction code 502 to be combined into the first mixed data packets 600; then, the circuit will select the first data packet of the fifth specific packet segment, the second data packet of the sixth specific packet segment, the third data packets of the seventh specific packet segment, the fourth data packet of the eighth specific packet segment as well as the second horizontal error correction code 506 to be combined into the second mixed data packets 604; then, the circuit will select the first data packet of the ninth specific packet segment, the third data packet of the eleventh specific packet segment, the data packets of the twelfth specific packet segment and the third horizontal error correction code 510 to be combined into the third mixed data packets 608; and select the first data packet of the thirteenth specific packet segment, the second data packet of the fourteenth specific packet segment, the third data packet of the fifteenth specific packet segment, the fourth data packet of the sixteenth specific packet segment and the fourth horizontal error correction code 514 to become the fourth mixed data packet 612. The second error correction code encoder 712 performs the error checking and correction encoding (e.g. parity code encoding) upon the first mixed data packet, the second mixed data packet, the third mixed data packet, and the fourth mixed data packet respectively, and generates a first vertical error correction code 602, a second vertical error correction code 606, a third vertical error correction code 610, and a fourth vertical error correction code 614 respectively. Finally, the packet generator 714 appends the first vertical error correction code 602, the second vertical error correction code 606, the third vertical error correction code 610, and the fourth vertical error correction code 614 to the first data packet 500 and the first horizontal error correction code 502 of the first channel, the second data packet 504 and the second horizontal error correction code 506 of the second channel, the third data packet 508 and the third horizontal error correction code 510 of the third channel, and the fourth data packet 512 and the fourth horizontal error correction code 514 of the fourth channel respectively, to obtain the encoded data packet of each channel, as shown in FIGS. 6A, 6B, 6C, and 6D. This alternative design also belongs to the scope of the present invention.

FIG. 3, FIGS. 6A, 6B, 6C, and 6D show that, no matter how many channels the error checking and correction circuit is based on to operate packet dividing and mixing, all use the same principle. For example, regardless of whether the number of channels is 2 (FIG. 3) or 4 (FIGS. 6A, 6B, 6C, and 6D), any mixed data packet will contain a part of packet data of the data packets obtained from different channels respectively, and the error checking and correction encoding will be performed for the mixed data packets to generate a vertical error correction code. The vertical error correction code, a data packet of some channel, and a horizontal error correction code will be combined as an encoded data packet. In other words, the two-channel packet dividing and mixing process shown in FIG. 3 is regarded as the basic operation type, and the two or more channel packet dividing and mixing process shown in FIG. 6A, FIG. 6B, FIG. 6C, and FIG. 6D is regarded as the extension of the basic operation type shown in FIG. 3.

Figure 8:
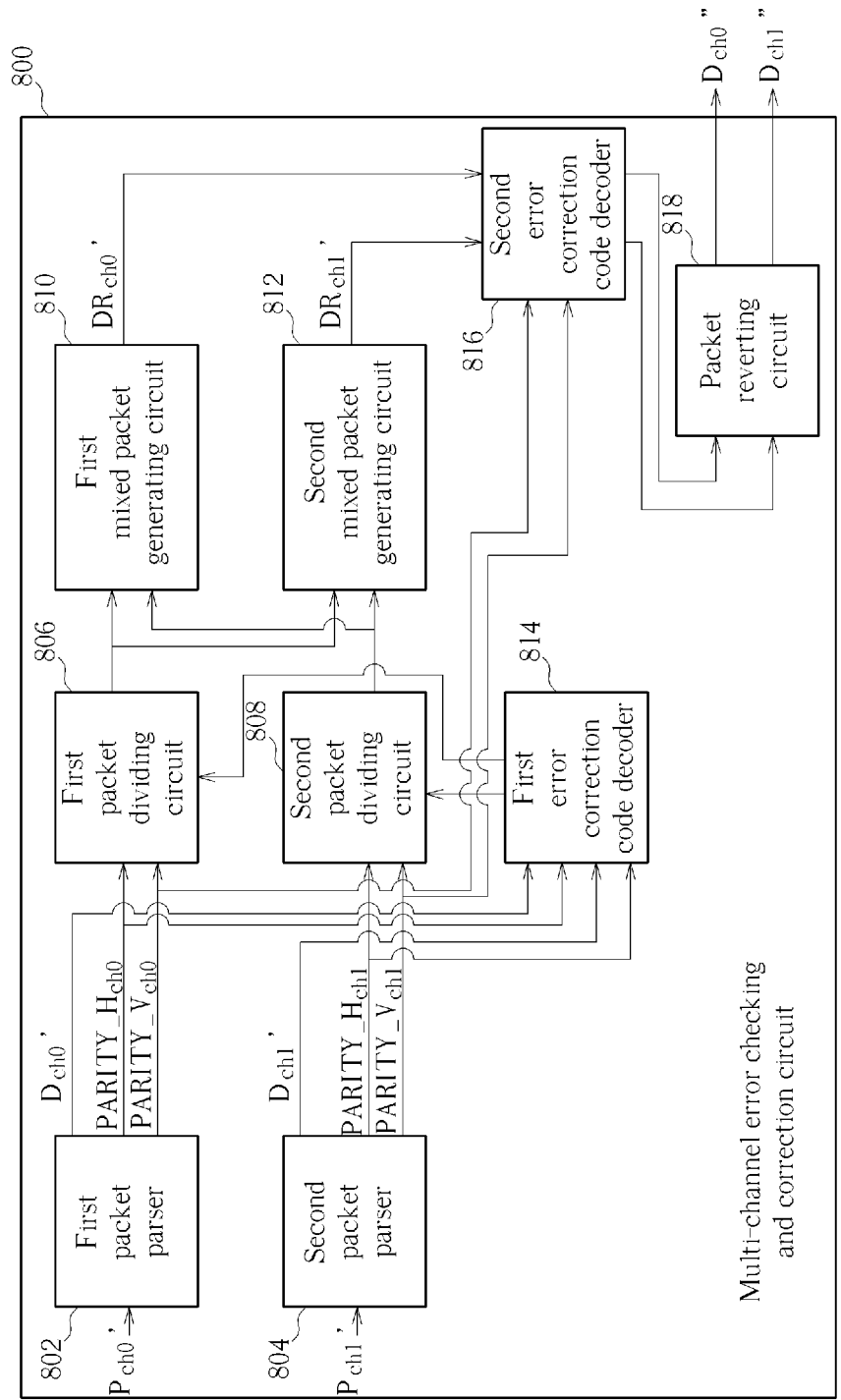
FIG. 8 is a diagram illustrating a multi-channel error checking and correction circuit according to an exemplary embodiment of the present invention.

Regarding the data read-out process 130 shown in FIG. 1, please refer to FIG. 8, which is a diagram illustrating a multi-channel error checking and correction circuit 800 according to an exemplary embodiment of the present invention. In this embodiment, the multi-channel error checking and correction circuit 800 is used to read data from a multi-channel memory (e.g. a flash memory) having at least a first channel and a second channel (e.g. the encoded data packet $P_{ch0}$ and $P_{ch1}$ written to the memory by the multi channel error checking and correction circuit 700). It should be noted that, under the premise of not affecting the disclosure of the present invention, a data read-out operation of a two-channel system is used to describe the disclosed multi-channel error checking and correction mechanism of the present invention. In practice, the disclosed multi-channel error checking and correction mechanism of present invention can be applied to a data read-out operation of an N-channel system, wherein N≥2. The multi-channel error checking and correction circuit 800 includes a first packet parser 802, a second packet parser 804, a first packet dividing circuit 806, a second packet dividing circuit 808, a first mixed packet generating circuit 810, a second mixed packet generating circuit 812, a first error correction code decoder 814, a second error correction code decoder 816, and a packet reverting circuit 818. Please note that the multi-channel error checking and correction circuit 800 shown in FIG. 8 is configured in conjunction with the multi-channel error checking and correction circuit 700 shown in FIG. 7. In other words, the multi-channel error checking and correction circuit 800 employs the vertical error correction code decoding method of two-channel data packets which corresponds to the vertical error correction code generation method of two-channel data packets shown in FIG. 4.

First, as shown in step 106, after a first encoded data packet $P_{ch0}'$ read out via a first channel is inputted to the multi-channel error checking and correction circuit 800, a first data packet $D_{ch0}'$, a first horizontal error correction code PARITY-$\_H_{ch0}'$, and a first vertical error correction code PARITY$\_V_{ch0}'$ will be parsed out from the first encoded data packet $P_{ch0}'$ by the first packet parser 802. Similarly, as shown in step 108, after a second encoded data packet $P_{ch1}'$ read out via a second channel is inputted to the multi-channel error checking and correction circuit 800, a second data packet $D_{ch1}'$, a second horizontal error correction code PARITY-$\_H_{ch1}'$, and a second vertical error correction code PARITY$\_V_{ch1}'$ will be parsed out from the second encoded data packet $P_{ch1}'$ by the second packet parser 804. It should be noted that, compared to the first encoded data packet $P_{ch0}$ and the second encoded data packet $P_{ch1}$ written into the memory originally in FIG. 7, the first encoded data packet $P_{ch0}'$ and the second encoded data packet $P_{ch1}'$ read out in FIG. 8 may be damaged because of noise in the channel or the memory itself being damaged; therefore the bit error condition exists. Compared to the first data packet $D_{ch0}$, the second data packet $D_{ch1}$, the first horizontal error correction code PARITY$\_H_{ch0}$, the first vertical error correction code PARITY$\_V_{ch0}$, the second horizontal error correction code PARITY$\_H_{ch1}$, and the second vertical error correction code PARITY$\_V_{ch1}$ shown in FIG. 7, the first data packet $D_{ch0}'$, the second data packet $D_{ch1}'$, the first horizontal error correction code PARITY$\_H_{ch0}'$, the first vertical error correction code PARITY$\_V_{ch0}'$, the second horizontal error correction code PARITY$\_H_{ch1}'$, and the second vertical error correction code PARITY$\_V_{ch1}'$ shown in FIG. 8 may have error bit (s), which is also the reason for the need of the error checking and correction circuit.

Regarding Step 110, error checking and correction decoding may be performed upon the first data packet $D_{ch0}'$ and the second data packet $D_{ch1}'$ by the first error correction code decoder 814 according to the first horizontal error correction code PARITY$\_H_{ch0}'$ and the second horizontal error correction code PARITY$\_H_{ch1}'$ respectively, to generate a first horizontal decoded data packet and a second horizontal decoded data packet. After the process of horizontal error correction is completed, if there are no more error bits in the data packets of all channels, this means that all error bit(s) have been checked and corrected and said data read-in process 130 has been completed. If, however, there are still error bit(s) which have not been corrected, the subsequent process of vertical error correction needs to proceed. The first horizontal decoded data packet and the second horizontal decoded data packet are recombined as a first mixed data packet $DR_{ch0}'$ and a second mixed data packet $DR_{ch1}'$ through the first packet dividing circuit 806, the second packet dividing circuit 808, the first mixed packet generating circuit 810, and the second mixed packet generating circuit 812 according to the method of data packet dividing and mixing shown in FIG. 3. Regarding the method of packet dividing and mixing, please refer to the descriptions related to FIG. 3, of which the details are omitted here for brevity. Error checking and correction decoding may be performed upon the first mixed data packet $DR_{ch0}'$ and the second mixed data packet $DR_{ch1}'$ by the second error correction code decoder 816 according to the first vertical error correction code PARITY$\_V_{ch0}'$ and the second vertical error correction code PARITY_V$_{ch1}$' respectively, to generate a first vertical decoded data packet and a second vertical decoded data packet. Finally, the packet reverting circuit 818 is utilized to allow the first vertical decoded data packet, and the second vertical decoded data packet to be restored into the first data packet D$_{ch0}$" and the second data packet D$_{ch1}$" which have the same arrangement as the first data packet D$_{ch0}$' and the second data packet D$_{ch1}$' (after the process of vertical error correction, the first data packet D$_{ch0}$' and the first data packet D$_{ch0}$" may not be the same; likewise, the second data packet D$_{ch1}$' and the second data packet D$_{ch1}$" may not be the same).

After the vertical error correction process is completed, if there are no more error bits in the data packets of all channels, this means that all error bit(s) have been checked and corrected and said data read-in process 130 has been completed. If, however, there are still error bit(s) which have not been corrected, meaning that the first data packet D$_{ch0}$" does not equal the first data packet D$_{ch0}$, or the second data packet D$_{ch1}$" does not equal the second data packet D$_{ch1}$, the first data packet D$_{ch0}$" and the second data packet D$_{ch1}$" need to be sent to the first error correction code decoder 814 for horizontal error correction process once more (the path from the first data packet D$_{ch0}$" and the second data packet D$_{ch1}$" to the first error correction code decoder 814 is not shown), or in an extreme case, said vertical error correction process need to be repeated more than once. No matter how many times the vertical error correction process need to be repeated, the process still belongs to the scope of the present invention.

The packet dividing and mixing method of the present invention is not limited to a two-channel system or a method which divides an original packet into two segments equally. In practice, any number of channels of a multi-channel memory system as well as any mechanism which can mix multi-channel data packets may be applied by the multi-channel error checking and correction circuit 800. After reading the above description, those skilled in the art will readily understand the error checking and correction circuit corresponding to FIG. 4, FIG. 6A, FIG. 6B, FIG. 6C, and FIG. 6D for data read-in process; details of the embodiment shown in FIG. 4, FIG. 6A, FIG. 6B, FIG. 6C, and FIG. 6D are omitted here for brevity.

Due to the independent characteristics between channels of a multi-channel memory, performing the horizontal and vertical error checking and correction process iteratively can greatly increase the success rate of the error correction. For example, assume the corresponding horizontal and vertical error correction code are able to correct 40-bits respectively, but there is a total of 50 error bits in the received first encoded data packet P$_{ch0}$' of the first channel, wherein 30 error bits are within the first specific packet segment, and another 20 error bits are within the third specific packet segment, and there is a total of 15 error bits in the received second encoded data packet P$_{ch1}$' of the second channel, wherein 5 error bits are within the second specific packet segment, and another 10 error bits are within the fourth specific packet segment. In the conventional read-in circuits, i.e. where there is no vertical error correction procedure, due to the error bits in the first encoded data packet P$_{ch0}$' and the second encoded data packet P$_{ch1}$' both exceeding the tolerance of the error correction code (i.e., 40 error bits), the first encoded data packet P$_{ch0}$' and the second encoded data packet P$_{ch1}$' will be discarded because it is not possible to correct the error bits. In the present embodiment, the first horizontal decoded data packet and the second horizontal decoded data packet are reassembled into a first mixed data packet DR$_{ch0}$' and a second mixed data packet DR$_{ch1}$' by way of data packet dividing and mixing, wherein the number of error bits in the first mixed data packet DR$_{ch0}$' is 35 (30 error bits in the first specific packet segment plus 5 error bits in the second specific packet segment), and the number of error bits in the second mixed data packet DR$_{ch1}$' is 30 (20 error bits in the third specific packet segment plus 10 error bits in the fourth specific packet segment), both being less than the upper limit (40 error bits) of the error bit tolerance. In this way, the subsequent vertical error correction code procedures can successfully correct all of the error bits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of error checking and correction applied in a multi-channel system, comprising:
   performing error checking and correction encoding upon a first data packet of a first channel and a second data packet of a second channel respectively, and generating a first horizontal error correction code and a second horizontal error correction code;
   performing error checking and correction encoding upon a first mixed data packet and a second mixed data packet, and generating a first vertical error correction code and a second vertical error correction code; and
   combining the first data packet, the first horizontal error correction code and the first vertical error correction code into the first encoded data packet of the first channel, and combining the second data packet, the second horizontal error correction code and the second vertical error correction code into the second encoded data packet of the second channel;
   wherein the first mixed data packet comprises a part of the first data packet and a part of the second data packet, and the second mixed data packet comprises a part of the first data packet and a part of the second data packet.

2. The method of claim 1, wherein the method of error checking and correction is applied in a memory access system.

3. The method of claim 1, wherein the first mixed data packet further comprises the first horizontal error correction code, and the second mixed data packet further comprises the second horizontal error correcting code.

4. The method of claim 1, further comprising:
   dividing the first data packet equally into a plurality of packet segments;
   dividing the second data packet equally into a plurality of packet segments;
   selecting at least a first specific packet segment of the plurality of packet segments of the first data packet and at least a second specific packet segment of the plurality of packet segments of the second data packet as at least a part of the first mixed data packet; and
   selecting at least a third specific packet segment of the plurality of packet segments of the first data packet and at least a fourth specific packet segment of the plurality of packet segments of the second data packet as at least a part of the second mixed data packet;
   wherein in the first data packet, each first specific packet segment is different from each third specific packet segment; and in the second data packet, each second specific packet segment is different from each fourth specific packet segment.

5. The method of claim 4, wherein the first specific packet segment comprises a plurality of discontinuous first specific packet segments of the plurality of packet segments of the first data packet; the second specific packet segment comprises a plurality of discontinuous second specific packet segments of the plurality of packet segments of the second data packet; the third specific packet segment comprises a plurality of discontinuous third specific packet segments of the plurality of packet segments of the first data packet; and the fourth specific packet segment comprises a plurality of discontinuous fourth specific packet segments of the plurality of packet segments of the second data packet.

6. A method of error checking and correction applied in a multi-channel system, comprising:
reading a first encoded data packet from a first channel, wherein the first encoded data packet comprises a first data packet, a first horizontal error correction code, and a first vertical error correction code;
reading a second encoded data packet from a second channel, wherein the second encoded data packet comprises a second data packet, a second horizontal error correction code, and a second vertical error correction code;
performing error checking and correction decoding upon the first data packet and the second data packet respectively according to the first horizontal error correction code and the second horizontal error correction code, and generating a first horizontal decoding data packet and a second horizontal decoding data packet; and
performing error checking and correction decoding upon a first mixed data packet and a second mixed data packet according to the first vertical error correction code and the second vertical error correction code, wherein the first mixed data packet comprises at least a part of the packet data of the first horizontal decoded data packet and a part of the packet data of the second horizontal decoded data packet, and the second mixed data packet comprises at least a part of the packet data of the first horizontal decoded data packet and a part of the packet data of the second horizontal decoded data packet.

7. The method of claim 6, further comprising:
after performing error checking and correction decoding upon the first mixed data packet and the second mixed data packet according to the first vertical error correction code and the second vertical error correction code, performing error checking and correction decoding according to the first horizontal error correction code and the second horizontal error correction code respectively.

8. The method of claim 6, wherein the method of error checking and correction is applied in a memory access system.

9. The method of claim 6, wherein the first mixed data packet further comprises the first horizontal error correction code, and the second mixed data packet further comprises the second horizontal error correcting code.

10. The method of claim 6, further comprising:
dividing the first horizontal decoded data packet equally into a plurality of packet segments;
dividing the second horizontal decoded data packet equally into a plurality of packet segments;
selecting at least a first specific packet segment of the plurality of packet segments of the first horizontal decoded data packet and at least a second specific packet segment of the plurality of packet segments of the second horizontal decoded data packet as at least a part of the first mixed data packet; and
selecting at least a third specific packet segment of the plurality of packet segments of the first horizontal decoded data packet and at least a fourth specific packet segment of the plurality of packet segments of the second horizontal decoded data packet as at least a part of the second mixed data packet;
wherein in the first horizontal decoded data packet, each first specific packet segment is different from each third specific packet segment; and in the second horizontal decoded data packet, each second specific packet segment is different from each fourth specific packet segment.

11. The method of claim 10, wherein the first specific packet segment comprises a plurality of discontinuous first specific packet segments of the plurality of packet segments of the first horizontal decoded data packet; the second specific packet segment comprises a plurality of discontinuous second specific packet segments of the plurality of packet segments of the second horizontal decoded data packet; the third specific packet segment comprises a plurality of discontinuous third specific packet segments of the plurality of packet segments of the first horizontal decoded data packet; and the fourth specific packet segment comprises a plurality of discontinuous fourth specific packet segments of the plurality of packet segments of the second horizontal decoded data packet.

12. A circuit of error checking and correction applied in a multi-channel system, comprising:
a first error correction code encoder, arranged for performing error checking and correction encoding upon a first data packet of a first channel and a second data packet of a second channel respectively, and generating a first horizontal error correction code and a second horizontal error correction code respectively;
a second error correction code encoder, arranged for performing error checking and correction encoding upon a first mixed data packet and a second mixed data packet, and generating a first vertical error correction code and a second vertical error correction code, wherein the first mixed data packet comprises at least a part of the packet data of the first data packet and a part of the packet data of the second data packet, and the second mixed data packet comprises at least a part of the packet data of the first data packet and a part of the packet data of the second data packet; and
a packet generator, arranged for combining the first data packet, the first horizontal error correction code, and the first vertical error correction code into the first encoded data packet of the first channel, and combining the second data packet, the second horizontal error correction code and the second vertical error correction code into the second encoded data packet of the second channel.

13. The circuit of claim 12, further comprising:
a first packet dividing circuit, arranged for dividing the first data packet equally into a plurality of packet segments;
a second packet dividing circuit, arranged for dividing the second data packet equally into a plurality of packet segments;
a first mixed packet generating circuit, arranged for selecting at least a first specific packet segment of the plurality of packet segments of the first data packet and at least a second specific packet segment of the plurality of packet segments of the second data packet as at least a part of the first mixed data packet; and
a second mixed packet generating circuit, arranged for selecting at least a third specific packet segment of the plurality of packet segments of the first data packet and at least a fourth specific packet segment of the plurality of packet segments of the second data packet as at least a part of the second mixed data packet;

wherein in the first data packet, each first specific packet segment is different from each third specific packet segment; and in the second data packet, each second specific packet segment is different from each fourth specific packet segment.

14. The circuit of claim 13, wherein the first specific packet segment comprises a plurality of discontinuous first specific packet segments of the plurality of packet segments of the first data packet; the second specific packet segment comprises a plurality of discontinuous second specific packet segments of the plurality of packet segments of the second data packet; the third specific packet segment comprises a plurality of discontinuous third specific packet segments of the plurality of packet segments of the first data packet; and the fourth specific packet segment comprises a plurality of discontinuous fourth specific packet segments of the plurality of packet segments of the second data packet.

15. A circuit of error checking and correction applied in a multi-channel system, comprising:
    a first packet parser, arranged for reading a first encoded data packet from a first channel, wherein the first encoded data packet comprises a first data packet, a first horizontal error correction code, and a first vertical error correction code;
    a second packet parser, arranged for reading a second encoded data packet from a second channel, wherein the second encoded data packet comprises a second data packet, a second horizontal error correction code, and a second vertical error correction code;
    a first error correction code decoder, arranged for performing error checking and correction decoding upon the first data packet and the second data packet respectively according to the first horizontal error correction code and the second horizontal error correction code, and generating a first horizontal decoding data packet and a second horizontal decoding data packet; and
    a second error correction code decoder, arranged for performing error checking and correction decoding upon a first mixed data packet and a second mixed data packet according to the first vertical error correction code and the second vertical error correction code, wherein the first mixed data packet comprises at least a part of the packet data of the first horizontal decoded data packet and a part of the packet data of the second horizontal decoded data packet, and the second mixed data packet comprises at least a part of the packet data of the first horizontal decoded data packet and a part of the packet data of the second horizontal decoded data packet.

16. The circuit of claim 15, wherein after performing error checking and correction decoding upon the first mixed data packet and the second mixed data packet according to the first vertical error correction code and the second vertical error correction code, the first error correction code decoder performs error checking and correction decoding according to the first horizontal error correction code and the second horizontal error correction code respectively.

17. The circuit of claim 15, further comprising:
    a first packet dividing circuit, arranged for dividing the first horizontal decoded data packet equally into a plurality of packet segments;
    a second packet dividing circuit, arranged for dividing the second horizontal decoded data packet equally into a plurality of packet segments;
    a first mixed packet generating circuit, arranged for selecting at least a first specific packet segment of the plurality of packet segments of the first horizontal decoded data packet and at least a second specific packet segment of the plurality of packet segments of the second horizontal decoded data packet as at least a part of the first mixed data packet; and
    a second mixed packet generating circuit, arranged for selecting at least a third specific packet segment of the plurality of packet segments of the first horizontal decoded data packet and at least a fourth specific packet segment of the plurality of packet segments of the second horizontal decoded data packet as at least a part of the second mixed data packet;
    wherein in the first horizontal decoded data packet, each first specific packet segment is different from each third specific packet segment; and in the second horizontal decoded data packet, each second specific packet segment is different from each fourth specific packet segment.

18. The circuit of claim 17, wherein the first specific packet segment comprises a plurality of discontinuous first specific packet segments of the plurality of packet segments of the first horizontal decoded data packet; the second specific packet segment comprises a plurality of discontinuous second specific packet segments of the plurality of packet segments of the second horizontal decoded data packet; the third specific packet segment comprises a plurality of discontinuous third specific packet segments of the plurality of packet segments of the first horizontal decoded data packet; and the fourth specific packet segment comprises a plurality of discontinuous fourth specific packet segments of the plurality of packet segments of the second horizontal decoded data packet.

* * * * *